United States Patent [19]
Arvidsson et al.

[11] Patent Number: 6,009,107
[45] Date of Patent: Dec. 28, 1999

[54] DATA TRANSMISSION SYSTEM

[75] Inventors: Carl-Erik Arvidsson; Carl-Gustaf Thisell, both of Stockholm, Sweden

[73] Assignee: Telefonaktiebolaget LM Ericsson, Stockholm, Sweden

[21] Appl. No.: 08/860,256

[22] PCT Filed: Jan. 10, 1996

[86] PCT No.: PCT/SE96/00010

§ 371 Date: Aug. 1, 1997

§ 102(e) Date: Aug. 1, 1997

[87] PCT Pub. No.: WO96/21897

PCT Pub. Date: Jul. 18, 1996

[30] Foreign Application Priority Data

Jan. 11, 1995 [SE] Sweden ................................. 9500081

[51] Int. Cl.$^6$ ............................................. H04J 3/06
[52] U.S. Cl. ............................ 370/535; 370/537; 370/542
[58] Field of Search ................................. 370/505, 506, 370/535, 536, 537, 538, 539, 541, 542, 543, 545, 465, 468

[56] References Cited

U.S. PATENT DOCUMENTS

| | | | |
|---|---|---|---|
| 4,803,654 | 2/1989 | Rasberry et al. | 711/110 |
| 4,819,201 | 4/1989 | Thomas et al. | 365/221 |
| 5,084,837 | 1/1992 | Matsumoto et al. | 710/38 |
| 5,132,970 | 7/1992 | Urbansky | 370/506 |
| 5,134,702 | 7/1992 | Charych et al. | 395/891 |
| 5,142,529 | 8/1992 | Parruck et al. | 370/545 |
| 5,172,260 | 12/1992 | Takatsu | 359/176 |
| 5,256,912 | 10/1993 | Rios | 327/144 |
| 5,305,253 | 4/1994 | Ward | 365/73 |
| 5,319,597 | 6/1994 | Adachi | 365/189.01 |
| 5,402,425 | 3/1995 | Bladh | 370/518 |
| 5,461,380 | 10/1995 | Peters et al. | 341/100 |
| 5,546,401 | 8/1996 | Lee et al. | 370/517 |
| 5,604,739 | 2/1997 | Buhrgard et al. | 370/468 |

FOREIGN PATENT DOCUMENTS

| | | |
|---|---|---|
| 226 017 | 6/1987 | European Pat. Off. . |
| 227 145 | 7/1987 | European Pat. Off. . |
| 485 021 | 5/1992 | European Pat. Off. . |
| 1 503 412 | 3/1978 | United Kingdom . |
| WO94/21062 | 9/1994 | WIPO . |
| WO95/10897 | 4/1995 | WIPO . |

*Primary Examiner*—Chau Nguyen
*Assistant Examiner*—Soon-Dong Hyun
*Attorney, Agent, or Firm*—Burns, Doane, Swecker & Mathis, L.L.P.

[57] ABSTRACT

A data transmission system, in which data streams shall be transmitted with great speed between a sending clock domain and a receiving clock domain, which operate with mutually different clock speeds, includes two system part circuits. One of these system part circuits is designed to receive from the first clock domain a data stream with the clock speed of the first clock domain and, controlled by this clock speed, serial/parallel convert the data stream to parallel data streams, each with a clock speed that is a certain fraction of the clock speed of the first clock domain. The other system part circuit is designed to receive the parallel data streams and, controlled by the clock speed of the other clock domain, parallel/serial convert them to an output data stream, which with the clock speed of the second clock domain is sent to the second clock domain.

5 Claims, 8 Drawing Sheets

DATA TRANSMISSION SYSTEM

BACKGROUND

The present invention generally relates to data transmission with speeds of an order of magnitude of several Gigabits/sec between two clock domains, of which each may be constituted by e.g. a CPU, a part of an ATM switch or other equipment which sends and receives data. ATM allows transmission of large data quantities over arbitrary media with the use of data packages with a prescribed length and small overhead.

More specifically, the invention relates to a data transmission system, in which data streams are to be transmitted at a large speed between a sending clock domain and a receiving clock domain, which work with mutually different clock speeds.

In two data transmission systems, which are working with approximately the same clock frequency generated by two separate oscillators, one in each system, and which are to be connected and transmit data to each other, a certain drift may occur between the frequencies. Because of this a buffer must be inserted between the two systems, which may emit data faster than it receives it, or vice versa, depending on which system's clock frequency is the larger one.

In the U.S. Pat. No. 5,305,253 a memory with separate read and write buses, two address ring counters, one for write and one for read operations, and an alarm which detects when the buffer is empty and full, is described. Since it is very difficult to make memories with a reply time shorter than 7 ns without resorting to the use of GA, this solution is not usable at frequencies of the order of magnitude of Gigabits/sec.

In the U.S. Pat. No. 4,819,201 an asynchronous FIFO circuit is described which includes consecutive data storage registers, which forward arriving data if the following register is empty. When the FIFO circuit is empty data will accordingly be let through from the beginning of the register stack to its end. This may cause risk for degradation of data and is furthermore a slow solution.

Among other publications relating to the same subject, the following may be mentioned.

U.S. Pat. No. 5,319,597 "FIFO memory and line buffer",

U.S. Pat. No. 5,084,837 "FIFO buffer with folded data transmission path permitting selective bypass of storage", U.S. Pat. No. 4,803,654 "Circular first-in, first-out buffer system for generating input and output addresses for read/write memory independently".

SUMMARY

A main object of the invention is, for a data transmission system of above defined art, to provide an improved buffer between two clock domains which are working with different clock speeds. This buffer shall be designed so that its way of working saves energy and simplifies operation at high frequencies, and so that no clock signal will have to be distributed over said buffer as a whole.

According to a first aspect the data transmission system according to the invention comprises a first system part circuit for receiving from the first clock domain a data stream having the clock speed of the first clock domain. The first system part circuit is controlled by this clock speed for serial/parallel converting the data stream to parallel data streams having each a clock speed being a certain fraction of the clock speed of the first clock domain. A second system part circuit receives the parallel data streams and is controlled by the clock speed of the second clock domain for parallel/serial converting them to an output data stream to the second clock domain having the clock speed of the second clock domain.

The first system part circuit may include an input node having a data input for the data stream from the sending clock domain, a control input for a clock signal representing the clock speed of the sending clock domain, data outputs for output data streams, and a first serial/parallel converter circuit for receiving the data stream and the clock signal for converting, controlled by the latter, the input data stream to the parallel data streams having each said clock speed fraction.

A first clock dividing circuit may be provided for converting, for each of the output data streams, the clock signal from the sending clock domain to an output clock signal representing said clock speed fraction.

The first system part circuit may have a tree structure comprising the input node in the form of a root node on a first level, and a number of further levels with leaf nodes. Each such leaf node includes a data input for one of the data streams from the leaf nodes of the preceding level, a control input for one of the clock signals with said clock speed fraction from the leaf nodes of the preceding level, data outputs for output data streams, a second serial/parallel converter circuit receiving the data stream and the clock signal from the preceding level and being controlled by this clock signal for converting the input data stream to output data streams having a clock speed constituting for each level, as seen in the direction from the root node, a successively smaller fraction of the sending clock domain's clock speed, a second clock dividing circuit for converting, for each of the output data streams, the clock signal from the preceding level to an output clock signal representing said successively smaller clock speed fraction, and outputs for these output clock signals.

The tree structure furthermore includes a final level with leaf nodes, of which each includes a data input for the data stream from the preceding level, a control input for the clock signal with said successively smaller clock speed fraction, data outputs for output data streams, and a third serial/parallel converter circuit receiving the data stream and the clock signal and being controlled by the latter for converting the input data stream to output data streams each having said successively smaller clock speed fraction.

The second system part circuit may include an output node having data inputs for parallel data streams, a data output for the data stream to the receiving clock domain, a control input for a clock signal representing the clock speed of the receiving clock domain, and a first parallel/serial converter circuit receiving the parallel data streams and being controlled by the clock signal for converting these to an output data stream.

Also the second system part circuit may have a tree structure which comprises an output node in the form of a root node on a final level, with data inputs for parallel data streams, a data output for the data stream to the receiving clock domain, a control input for a clock signal representing the clock speed of the receiving clock domain, a first parallel/serial converter circuit receiving the parallel data streams and being controlled by the clock signal for converting these to an output data stream, and a third clock dividing circuit for converting the clock signal received on the control input to a clock signal having a clock speed being a certain fraction of the clock speed of the input clock signal. A number of further levels of leaf nodes include data inputs to a multiplexer circuit for parallel data streams from leaf nodes on the closest upper level, a data output for a data stream created by the multiplexer circuit to a node on the closest lower level, a control input for a clock signal received from the closest lower level and controlling the operation of the multiplexer circuit, and a fourth clock dividing circuit receiving the clock signal from the closest lower level and creating therefrom a clock signal having a clock speed being a certain fraction of the clock speed of the input clock signal, said clock signal being supplied to the control input of a node on the closest higher level. A highest level of leaf nodes each include data inputs to a multiplexer circuit for parallel data streams from the first circuit, a data output for a data stream created by the multiplexer circuit to a node on the closest lower level, and a control input for a clock signal received from the closest lower level and controlling the operation of the multiplexer circuit.

A FIFO circuit can be connected between the first and second system part circuits, which comprises a memory device of sequential type, into which the data streams from the first system part circuit are entered controlled by the clock speed of the first clock domain, and from which data is read out to the second system part circuit controlled by the clock speed of the second clock domain.

The memory device may include a number of memories of sequential type, corresponding to the number of data outputs of each leaf node on the final level of the first system part circuit. Each memory has a data input, to which a data output from each leaf node of the final level of the first system part is commonly connected, a data output, which is connected to a data input of each leaf node on the highest level of the second system part circuit, a control input for one of the clock signals transferred to the final level of the first system part circuit, a data input control input from an output of a first counter having an input connected for receiving as a control signal one of the clock signals which are transferred to the final level of the first system part circuit, and a data output control input from a second counter having an input connected for receiving as a control signal one of the clock signals which is transferred to the highest level of the second system part circuit.

According to a second aspect the data transfer system of the invention has a first circuit which is designed to receive a fast serial data flow with a first clock speed and serial/parallel convert it, and a second circuit designed to parallel/serial convert the resulting parallel data flow from the first circuit to a fast serial data flow with a second clock speed.

The first circuit may be tree shaped with nodes, each of which includes two data storage elements and possibly a clock divider. The data storage elements may be latches, data flip-flops or other elements with storage capacity. The clock divider may be designed with two such data storage elements.

The second circuit may be constituted by a tree shaped structure where each node includes a multiplexer for a parallel data flow from the first circuit, and possibly a clock divider.

An important feature of these first and second circuits is that they may be designed so that no output from a node reaches more than four inputs of another node, whether it is the case of a data signal or a clock signal. The wiring can also be made short since no signal needs to move further than to the next level of the same branch, i.e. only from one node to another.

The invention means that a minimal number of gates need to be switched during each cycle, which saves energy and simplifies operation at high frequencies. No clock signal needs to be distributed over a whole chip containing the first and second circuits.

The invention can be used in every area where data shall be transmitted with high speeds between different clock domains. As an example fibre optical communication may be mentioned.

The multiplexer in a node in the second circuit may be replaced by two storage elements with open collector output or a partial structure consisting of two storage elements and one multiplexer. This should only be necessary if data on the inputs is limited to less than 50% of the time.

The invention can be used to provide a ramp to and from a slow elastic FIFO.

BRIEF DESCRIPTION OF THE DRAWINGS

Embodiments of the invention will now be described more closely with reference to the attached drawings.

In the drawings

DETAILED DESCRIPTION

Figure 1:
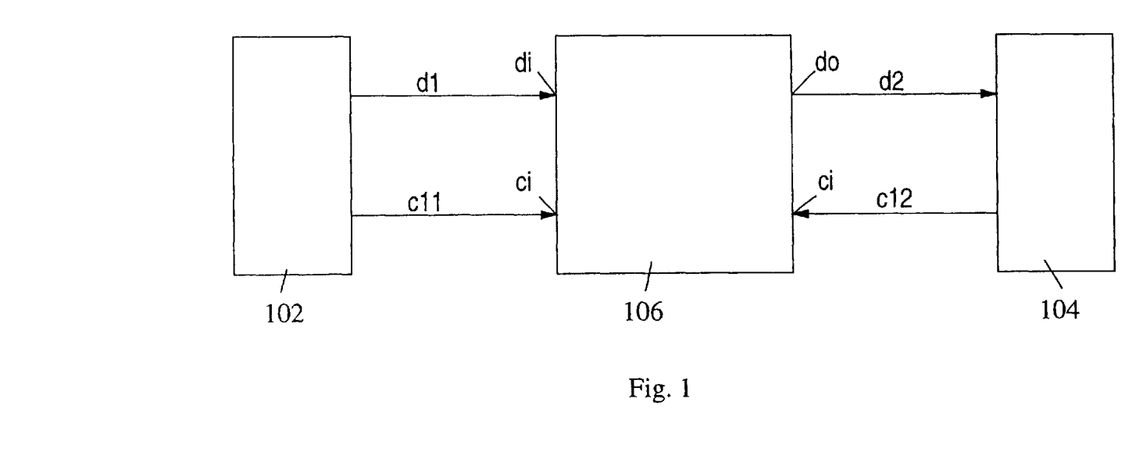
FIG. 1 shows a principal sketch of a data transmission system according to the invention.

In FIG. 1 the numbers 102 and 104 denote a respective clock domain. The clock domains 102 and 104 may e.g. each be a CPU, a part of an ATM switch or some other equipment sending or receiving data, respectively. The clock domain 102 has an internal clock oscillator which operates with a first clock speed cl1, and the clock domain 104 has an internal clock oscillator that operates with a second clock speed cl2, which differs from the first clock speed.

The two clock domains 102 and 104 shall transmit data to each other. Because of the different clock speeds of the two clock domains a circuit 106 must be present in the transmission route, which causes that serial data d1 which leaves the first clock domain 102 with a data speed prescribed by the first clock speed cl1 arrives at the second clock domain 104 in the form of serial data d2 with the same bit content but with a data speed adjusted to the second clock speed c12.

If two way communication between the two clock domains is desirable, an arrangement corresponding to the above described arrangement for communication in the direction from the clock domain 102 to the clock domain 104, can exist in the opposite direction, i.e. for communication in the direction from the clock domain 104 to the clock domain 102. That just stated is also applicable to the embodiments described more in detail below, which are based on the same basic idea as the embodiment according to FIG. 1.

For the case of sending data from clock domain 102 to clock domain 104, di and ci (data input and clock input, resp.) denote a data input and a control input, respectively, on the input side of the circuit 106 for the data stream d1 and a clock signal c11 from the clock domain 102, respectively. In the below described different embodiments, the clock domain corresponding to the clock domain 102 for the case just mentioned, will be called receiving clock domain. Still for the same case, on the output side of the circuit 106 a data output for the data stream d2 is denoted do, and a control input for a clock signal c12 from the clock domain 104 is denoted ci.

Generally below, the designation dl will be used for a data stream from the sending clock domain and the designation d2 will be used for a data stream to the receiving clock domain. The designations c11 and c12 will be used for a clock signal from the sending clock domain and a clock signal from the receiving clock domain to the output side of the circuit 106, respectively.

The designation di, with an addition, if any, to be described more closely below, will be used for each data input in the circuit 106. The designation do, with an addition, if any, to be described more closely below, will be used for each data output in the circuit 106. The designation ci will be used for each control input in the circuit, which receives a certain clock signal, and a designation cip will be used for each control input that receives a clock signal that is inverted with respect to the first mentioned clock signal. The designations ci and cip will always occur in pairs.

Furthermore the designation co (clock output), with an addition, if any, to be described more closely below, will be used for each clock output of the circuit on which a certain clock signal is emitted, and the same designation with a possible addition ended by p will be used for each clock output that emits a clock signal that is inverted with respect to the first mentioned clock signal. Also here the two output types occur in pairs.

Figure 2:
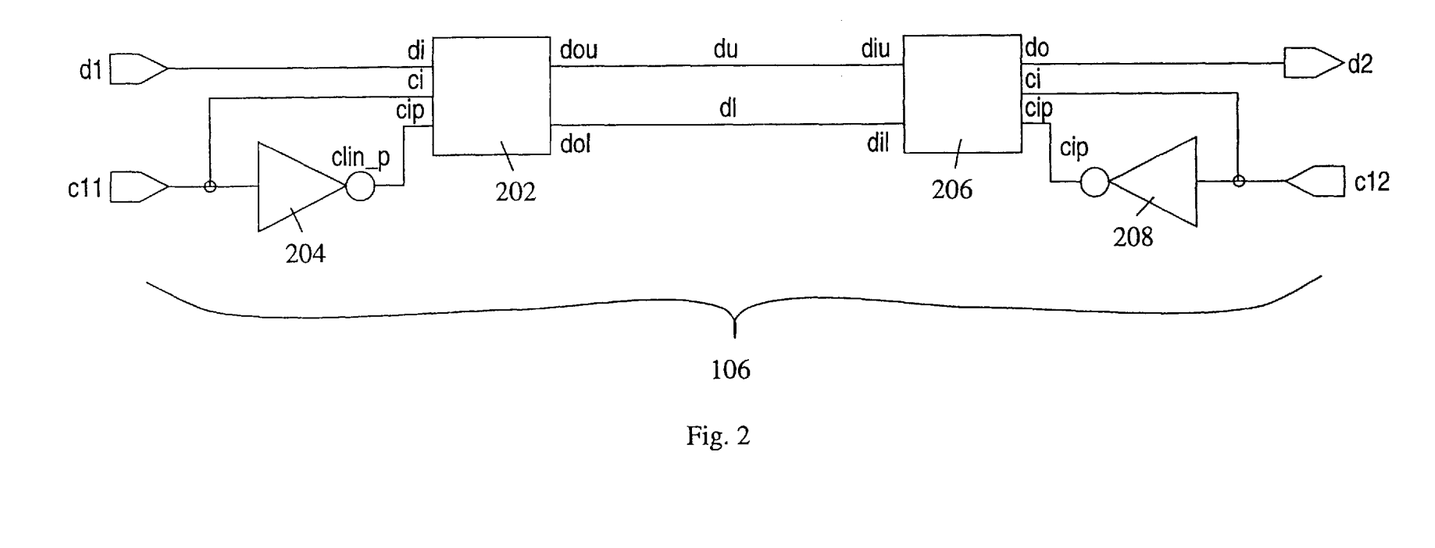
FIG. 2 shows a first embodiment of the data transmission system according to FIG. 1.

A first simple embodiment of the circuit 106 in FIG. 1 in the form of a two bit FIFO is shown in FIG. 2. The circuit includes a serial/parallel converter 202, which receives the data stream at di and converts it to two data streams du (data upper) and dl (data lower) on each an output dou (data output upper) and dol (data output lower), respectively. The clock signal c11 is transferred to a control input ci and an inverter 204, from which an inverted clock signal is transferred to a control input cip. Here, as well as in the following embodiments, the inverted clock signal can of course be transferred directly from the respective clock domains. In the serial/parallel converter 202 the two data streams du and dl have each been given a data speed which is half of the data speed on the input di.

The data streams du and dl are received on data inputs diu (data input upper) and dil (data input lower), respectively, of a serial/parallel converter 206 and are there converted to the output data stream d2 with a data speed prescribed by the clock speed c12 of the receiving clock domain, which is emitted on a data output do of the circuit 206. This is performed by means of the clock signal c12 of the second clock domain, which is transferred to a control input ci of the circuit 206 and an inverter 208, from which a clock signal inverted with respect to the clock signal c12 is transferred to a control input cip of the circuit 206. If two way communication is desired, a corresponding arrangement can exist in the opposite direction, i.e. from the clock domain 104 to the clock domain 102.

Figure 3:
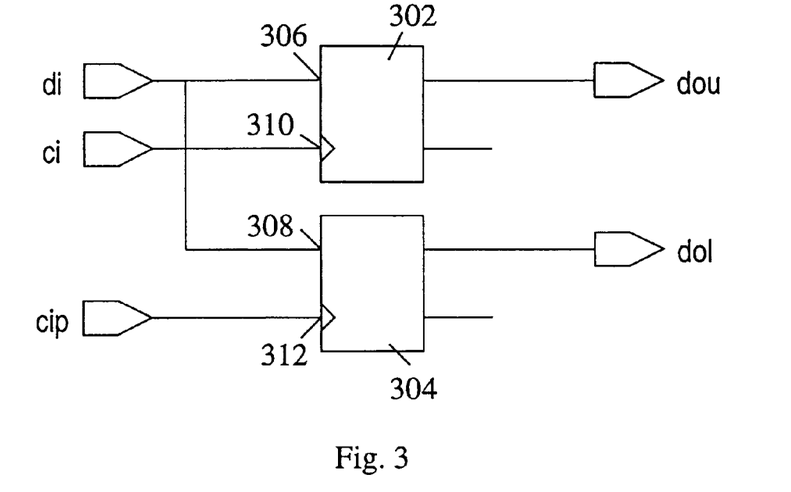
FIG. 3 shows an input node in the form of a serial/parallel converter circuit included in the embodiment of FIG. 2.

In FIG. 3 as an example a more detailed embodiment of the serial/parallel converter 202 is shown. The circuit according to FIG. 3 more specifically includes two data storage elements 302 and 304, e.g. in the form of data flip-flops. The flip-flops 302 and 304 each receive on a data input 306 and 308, respectively, the data signal d1 from the input di. The flip-flops 302 and 304 furthermore each have a control input 310 and 312, respectively, on which they receive the clock signal from the control inputs ci and cip, respectively, of the circuit 202. The flip-flops 302 and 304 each have an output connected to the data output dou and dol, respectively. On an edge of the respective clock signal at the gates 310 and 312, respectively, the data stream d1 is clocked out in the flip-flops 302 and 304 for getting the data streams du and dl on the outputs dou and dol, respectively.

Figure 4:
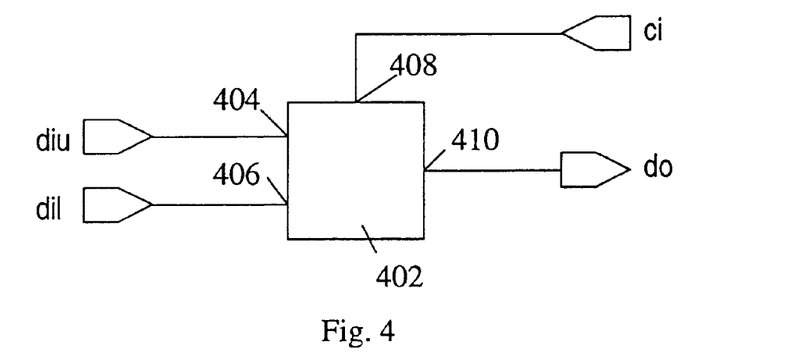
FIG. 4 shows an output node in the form of a parallel/serial converter circuit included in the embodiment of FIG. 2.

In FIG. 4 an embodiment is shown of the parallel/serial converter 206 in FIG. 2, in the form of e.g. a multiplexer 402. The data streams du and dl on the inputs diu and dil, respectively, are each received on a respective input 404 and 406 of the multiplexer 402. The multiplexer 402 has a control input 408 for the clock signal c12 on the control input ci of the circuit 206, and a data output 410, which is connected to the data output do of the circuit 206 for the data stream d2. Controlled by the clock signal c12, the data streams du and dl are assembled in the multiplexer 402 to the data stream d2.

Of the signals occurring in FIG. 2, FIGS. 5a–f as an example show the appearance of the clock signal c11 from the first clock domain, the data stream consisting of two bits 502 and appearing on di, the data stream d2 arriving to the second clock domain from do, the clock signal c12 from the second clock domain, the data stream du and the data stream dl, respectively. The bit sequence of the data stream d1 has been chosen so that du and dl shall change value each time that new data is entered, i.e. on the rising edge of the clock signal c11 for du, and for falling edge for dl.

Figure 5:
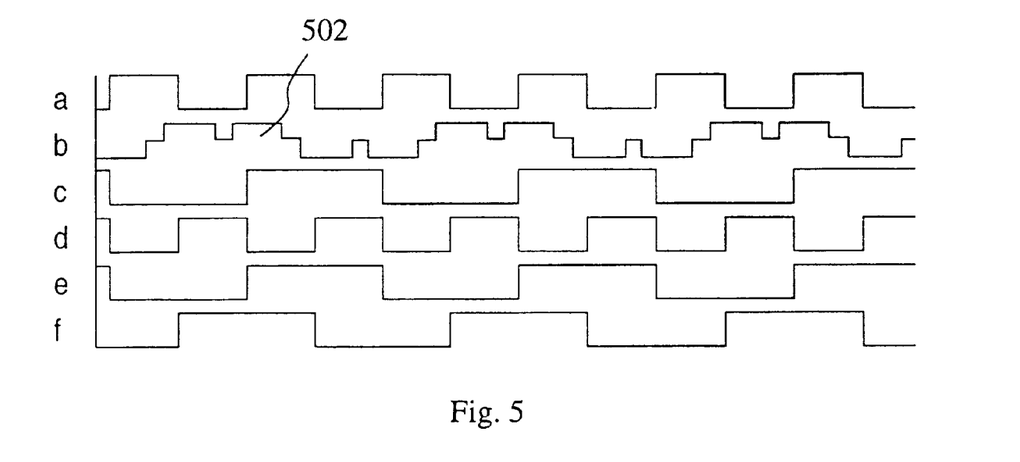
FIG. 5 shows a signal diagram including the signals appearing in the embodiment according to FIGS. 2–4.

From FIG. 5 it appears that du is triggered on and off, respectively, on the rising edge of two consecutive pulses of the signal c11, and that the corresponding is happening for dl on the falling edge on two consecutive clock pulses. It furthermore appears that this results in the data stream d2 being exactly in phase with the clock signal c12. The mid level in three places of the two data bits 502 furthermore indicates that data is not defined.

Figure 6:
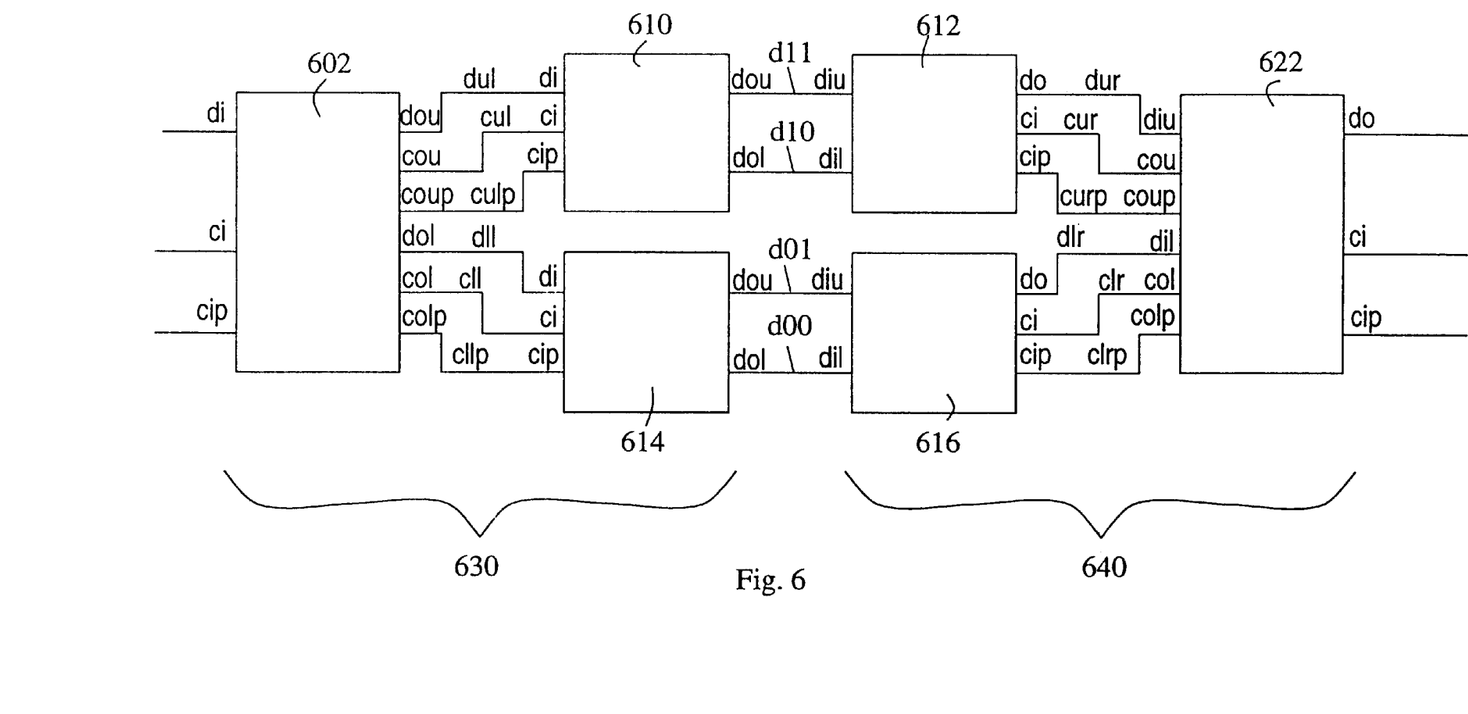
FIG. 6 shows a second embodiment of the data transmission system according to FIG. 1.

A further embodiment of the circuit 106, in the form of a four bit FIFO is shown in FIG. 6. In this embodiment the serial data stream d1 and the clock signal c11 are received from the sending clock domain, as is the inverted clock signal on inputs di, ci and cip, respectively, of an input node 602 with serial/parallel converting and clock dividing function.

Figure 7:
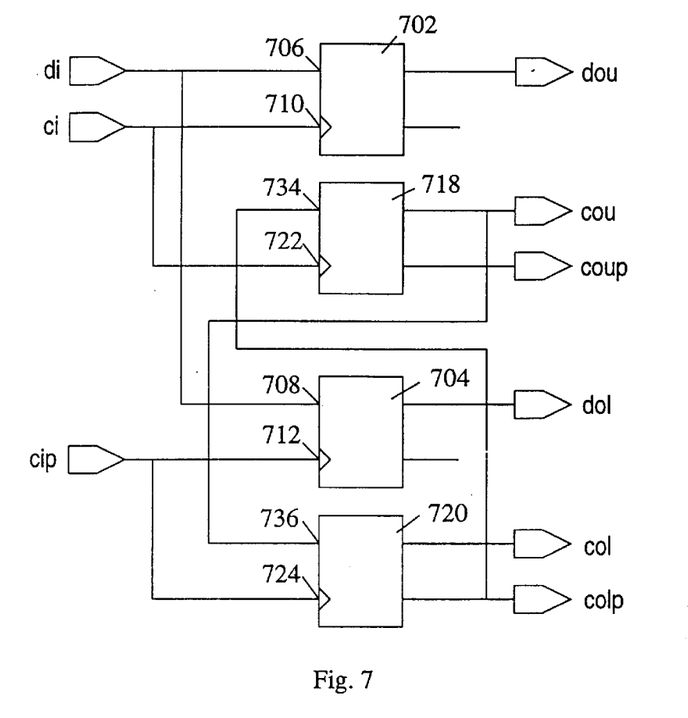
FIG. 7 shows an input node in the form of a serial/parallel converter circuit included in the embodiment according to FIG. 6.

Referring to FIG. 7 an embodiment of the input node 602 may include a data storage circuit, which e.g. is designed in the same way as the one in FIG. 3. It thus includes two data storage elements 702 and 704, each of which on its data input 706 and 708, respectively, receives the data stream from the input di. The switch 702 receives on a control input 710 the clock signal c11 from the input ci. The switch 704 receives on a control input 712 the inverted clock signal from the input cip. The flip-flops 702 and 704 furthermore each have a data output leading to data outputs dou and dol, respectively, of the input node 602, on which an output data stream is clocked out by the clock signal c11 and the clock signal inverted therefrom, respectively.

The input node according to FIG. 7 furthermore includes a clock divider circuit including two flip-flops 718 and 720, respectively. The flip-flop 718 receives on a control input 722 the clock signal c11 from the input ci, and the flip-flop 720 receives on a control input 724 the inverted clock signal from the input cip. The flip-flops 718 and 720 furthermore each have two clock outputs leading to clock outputs cou (clock output upper), coup and col (clock output lower), colp, respectively, of the input node 602. The output of the flip-flop 720 connected to the clock output colp is connected to a data input 734 of the flip-flop 718 and the output of the flip-flop 718 connected to the clock output cou is connected to a data input 736 of the flip-flop 720.

From the input node 602 in FIG. 6 the data stream denoted dul (data upper left) on the data output dou is transferred, as is the clock signal denoted cul (clock upper left) on the clock output cou and its inverted value denoted culp on the clock output coup, to inputs di, ci and cip, respectively, of a serial/parallel converter 610 of the same kind as the serial/parallel converter 202 in FIG. 2. In the same way as in FIG. 2 the data outputs dou and dol of the serial/parallel converter 610 are connected for transmission of their data streams d11 and d10, respectively, to inputs diu (data input upper) and dil (data input lower), respectively, of a parallel/serial converter 612 of the same kind as the parallel/serial converter 206 in FIG. 2.

A similar serial arrangement of a serial/parallel converter 614 and a parallel/serial converter 616 is connected for receiving a data stream d11 (data lower left), a clock signal c11 (clock lower left), and a clock signal clip from the data and clock outputs dol, col and colp, respectively, of the input node. Corresponding inputs of the serial/parallel converter 614 are denominated di, ci and cip, respectively. The data outputs of the latter are denominated dou and dol, respectively, corresponding inputs of the parallel/serial converter 616 are denominated diu and dil, respectively, and the two data signals are denominated d01 and d00.

Data outputs do and control inputs ci and cip of each of the circuits 612 and 616, corresponding to those of the circuit 204 in FIG. 2, are connected to a data input diu and clock outputs cou and coup, and a data input dil, and clock outputs col and colp of an output node 622, respectively. In FIG. 6 the data signals leaving the respective circuits 612 and 616 are denominated dur (data upper right) and dlr (data lower right), respectively, and the respective clock signals received from the output node are denominated cur (clock upper right) and curp, and clr (clock lower right) and clrp, respectively. The output node 622 emits on an output do the corresponding data stream d12 and creates the just mentioned clock signals by means of the clock signal c12 from the sending clock domain and its inverted value, respectively, on the control inputs ci and cip.

Figure 8:
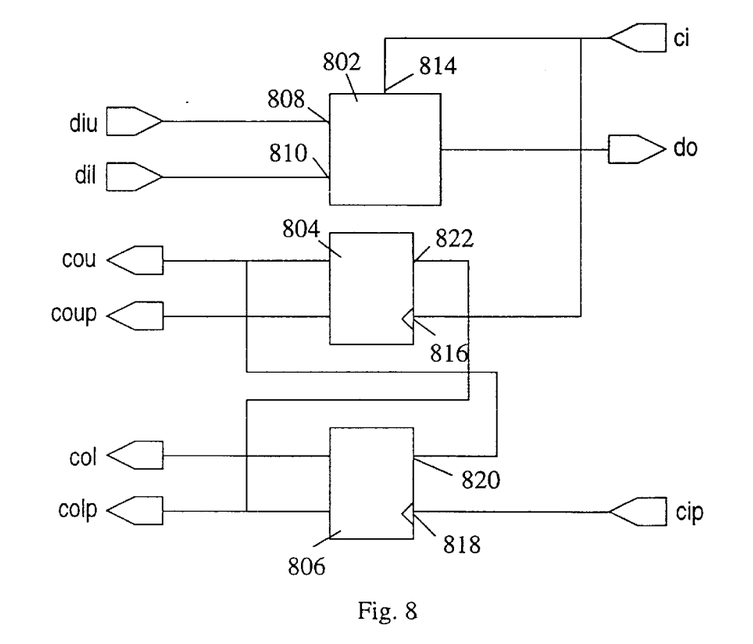
FIG. 8 shows an output node in the form of a parallel/serial converter circuit included in the embodiment according to FIG. 6.

An embodiment of the output node 622 is shown in greater detail in FIG. 8. In the Figure there are shown the data inputs diu and dil of the output node 622 for the data streams dur and dlr, and data output do for the data stream d2 to the receiving clock domain. Likewise, there are shown the control inputs ci and cip of the output node 622 for the clock signal c12 from the receiving clock domain and its inverted value, respectively, and the clock outputs cou, coup, col and colp, respectively, for the clock signals cur, curp, clr and clrp, respectively.

The circuit shown in FIG. 8 includes a multiplexer 802 and a clock divider consisting of two flip-flops 804 and 806. The multiplexer 802 has two data inputs 808 and 810 connected to the data inputs diu and dil. The clock signal c12 from the control input ci is transferred to the multiplexer 802 at an input 814 for controlling multiplexing of the data streams diu and dil so that the data stream d2 is achieved on the output do.

The clock divider 804, 806 is designed in mainly the same way as the clock divider 718, 720 in FIG. 7. It thus receives the clock signal c2 from the control input ci on a control input 816 of the flip-flop 804, and the inverted clock signal from the control input cip on a control input 818 of the flip-flop 806. The flip-flop 804 has two outputs connected to the clock outputs cou and coul, respectively, and the flip-flop 806 have two outputs connected to the clock outputs col and colp, respectively. The clock output cou from the flip-flop 804 has a connection to a data input 820 of the flip-flop 806, and the clock output colp from the flip-flop 806 has a connection to a data input 822 of the flip-flop 804.

Figure 9:
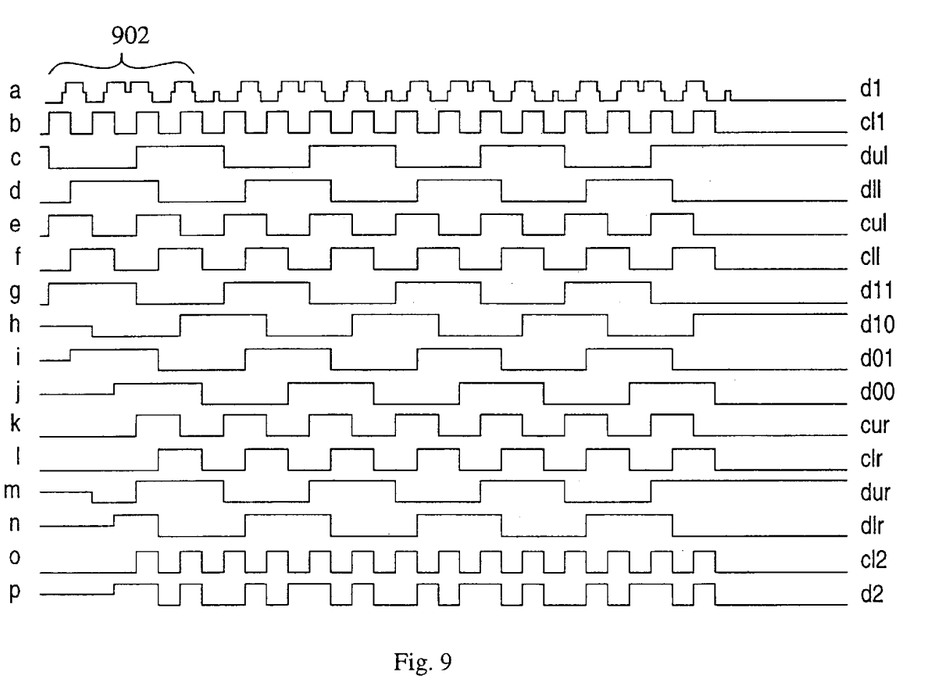
FIG. 9 shows a signal diagram including the signals appearing in the embodiment according to FIGS. 6–8.

The look of the signals appearing in the circuit according to FIG. 6 is shown in FIGS. 9a–p. FIG. 9a shows the data signal d1, containing four bits 902, from the sending clock domain on the data input di of the input node 602. FIG. 9b shows the clock signal c11 of the sending clock domain on the control input ci of the input node 602.

The diagrams in FIGS. 9c and 9d show the appearance of the data streams dul and dll arriving from the input node 602, and the diagrams in FIGS. 9e and 9f show the appearance of the corresponding clock signals cu1 and cl1, respectively.

FIGS. 9g–j show the appearance of the data streams d11, d10 and d01, d00 arriving from the circuits 610 and 614, respectively.

FIGS. 9k and 9l show the appearance of the clock signals cur and clr arriving from the end node 622 to the control input ci of the circuit 612 and the control input ci of the circuit 616, respectively. The appearances of the data streams dur and dlr arriving from the respective circuits 612 and 616 to the end node 622 are shown in FIGS. 9m and 9n, respectively.

The appearances of the clock signal c12 of the receiving clock domain and the data stream d2 directed to it, respectively, are shown in FIGS. 9o and 9p, respectively.

The following appears from FIG. 9. The data signals dul and dll are triggered on and off on rising and falling edge, respectively, of every second pulse of the clock signal c11. The clock signals cul and cll are triggered on and off, respectively, on the rising and falling edge, respectively, of every pulse of the clock signal c11. The data signals d10 and d01 are triggered on and off on the falling and rising edge, respectively, of the clock signal cu1. The data signals d11 and d00 are triggered on and off on the rising and falling edge, respectively, of the clock signal c11. The data signals dur and dlr are triggered on and off on the rising edges of consecutive pulses of the clock signals cur and clr, respectively. The result is, as is made clear by the Figure, that the data signal d2 is supplied to the receiving clock domain synchronously with the clock signal c12 thereof.

Figure 10:
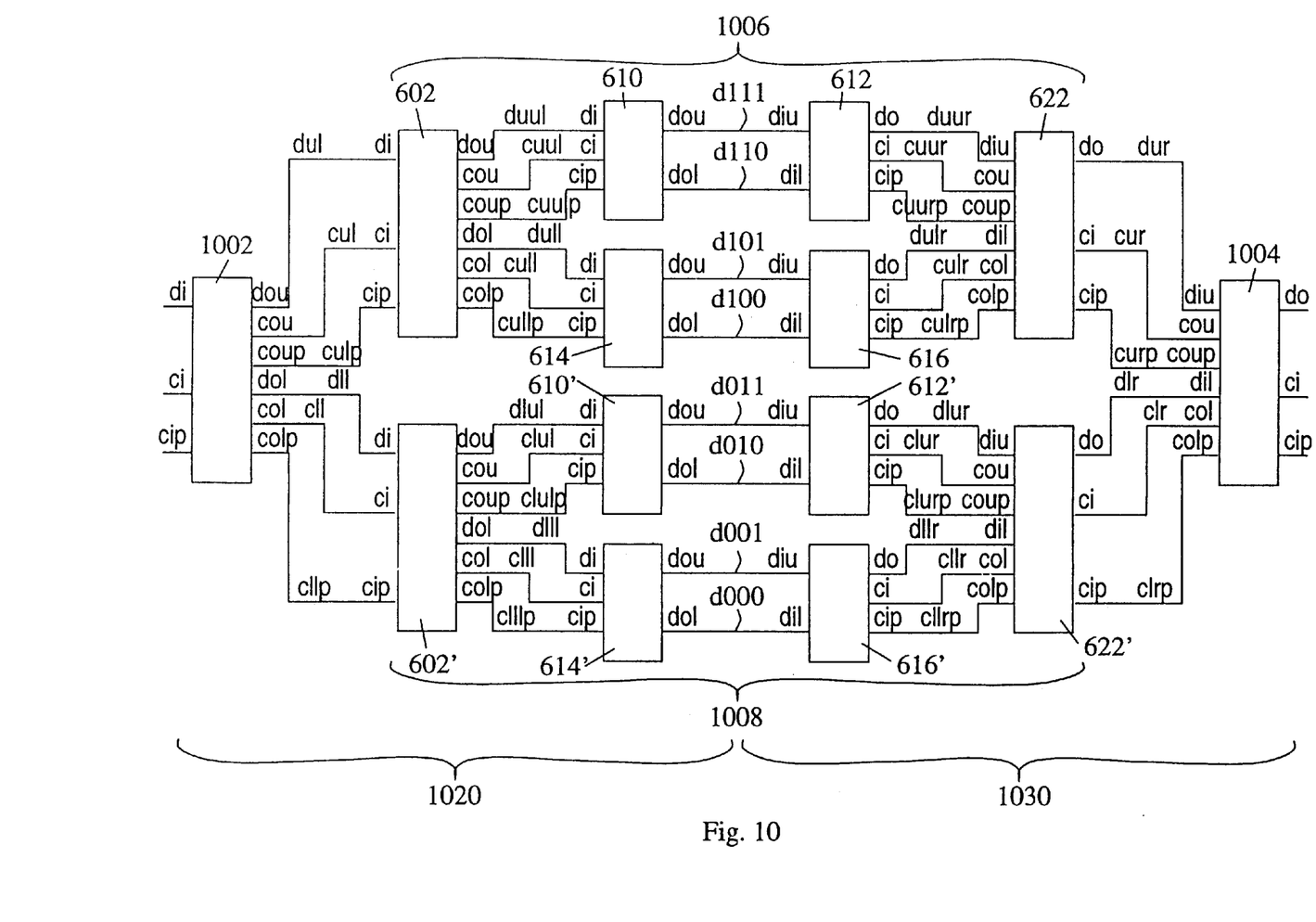
FIG. 10 shows a third embodiment of the data transmission system according to FIG. 2, FIGS. 11–13 show signal diagrams containing the signals appearing in the embodiment according to FIG. 10.

In FIG. 10 there is shown a further embodiment of the circuit 106 in FIG. 1, in the form of an eight bit FIFO. This embodiment includes an input node 1002 and an output node 1004. With respect to their design and way of operation the input node 1002 and the output node 1004 correspond to the input node 602 and the output node 622, respectively, in FIG. 6, and the description thereof does not need to be repeated here.

Between the two nodes 1002 and 1004 two part circuits 1006 and 1008, each of the same design as the circuit 602–622 in FIG. 6, are arranged in parallel. The circuit components included in the circuit 1006 have therefore been provided with the same reference designations as corresponding components in FIG. 6 and the same circuit components in the circuit 1008 have been provided with the same reference designations with the addition of prime signs. As concerns designations for outputs, inputs and signals the same convention as before is used.

The two sets of data output dou and clock outputs cou, coup and data output dol and clock outputs col and colp, respectively, of the input node 1002 are each connected to a corresponding set of data input di and control inputs ci, cip of each circuit 602 and 602' respectively. As regards the signals forwarded to these inputs, the data signals are denoted dul and dll, respectively, and the clock signals are denoted cul, culp and cll, cllp, respectively, in FIG. 10.

The two sets of data input diu, clock outputs cou, coup and data input dil, clock outputs col, colp, respectively, of the output node 1004 are each connected to a corresponding set of data output do and control inputs ci, cip of each of the circuits 622 and 622', respectively. The data signals forwarded from the data outputs do of the nodes 622 and 622', respectively, are denoted dur and dlr, respectively, and the clock signals forwarded to the two sets of control inputs ci, cip of the same nodes are in FIG. 10 denoted cur, curp and clr, clrp, respectively.

The signal treatment in each of the circuits 1006 and 1008 is exactly the same as in corresponding circuit in FIG. 6.

The two data signals from the respective node 602 and 602' to the circuits 610 and 614, and 610' and 614', respectively, are denoted duul (data upper upper left), dull (data upper lower left) and dlul (data lower upper left), dll (data lower lower left), respectively.

The four clock signals from the respective node 602 and 602' to the circuits 610 and 614, and 610' and 614' , respectively, are denoted cuul (clock upper upper left), cuulp and cull (clock upper lower left), cullp and clul (clock lower upper left), clulp and clll (clock lower lower left), clllp, respectively.

The two data signals between each of the circuits 610, 614, 610', 614', on the one hand, and each of the circuits 612, 616, 612', 616', on the other hand, are denoted d111, d110 and d101, d100 and d011, d010 and d001, d000, respectively.

The two data signals from the circuits 612 and 616, on the one hand, to the two data inputs of the node 622, on the other hand, are denoted duur (data upper upper right) and dulr (data upper lower right), respectively, and the two data signals from the circuits 612', 616', on the one hand, to the two inputs of the node 622', on the other hand, are denoted dlur (data lower upper right) and dllr (data lower lower right), respectively. The two pairs of clock signals from each of the nodes 622 and 622', on the one hand, to the two control inputs of the respective circuits 612, 616, 612' and 616', on the other hand, are denoted cuur (clock upper upper right), cuurp and culr (clock upper lower right), culrp and clur (clock lower upper right), clurp and cllr (clock lower lower right), cllrp, respectively.

The clock signals cur, curp and clr, clrp from the end node 1004 are supplied to the two inputs ci and cip of the two nodes 622 and 622', respectively.

Figure 11:
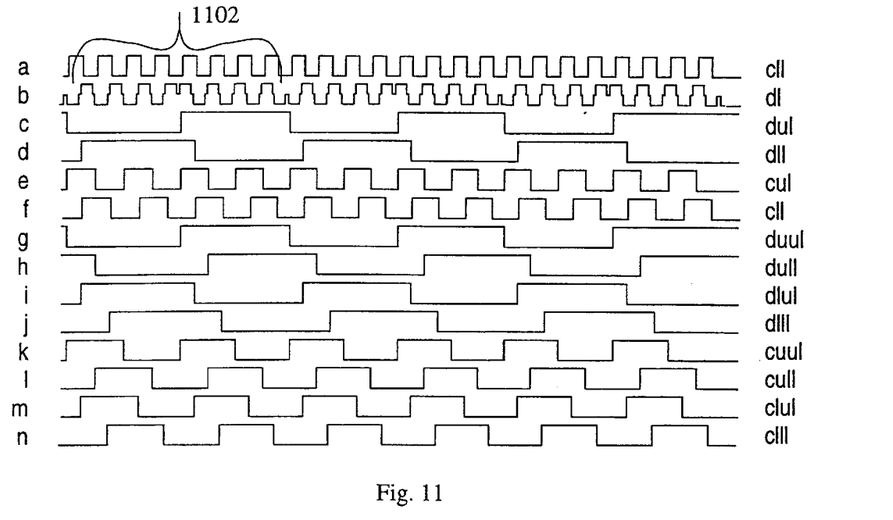

In FIGS. 11a–n the appearance of the signals on the left side of the circuit in FIG. 10 is shown up to and including the outputs from the nodes 602 and 602'. FIGS. 11a and 11b show the clock signal c11 of the sending clock domain, and its data signal d1 containing eight bits 1102, respectively. FIGS. 11c and 11d show the appearance of the data streams dul and dll from the input node 1002. FIGS. 11e and 11f show the appearance of the corresponding clock signals cul and cll. FIGS. 11g, 11h and 11i, 11j show the appearance of the data signals duul, dull and dlul, dlll, respectively, from the nodes 602 and 602', respectively. FIGS. 11k, 11l and 11m, 11n show the appearance of the corresponding clock signals cuul, cull and clul, clll, respectively.

Figure 12:
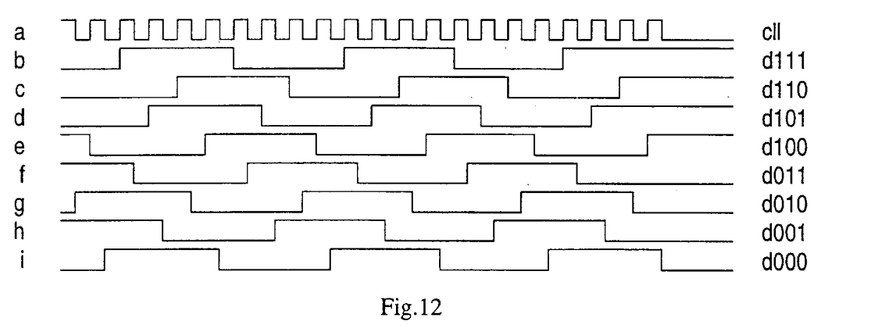

FIG. 12a again shows the clock signal c11 from the sending clock domain. FIGS. 12b–i show the appearance of the data signals d111, d110, d101, d100, d011, d001, d000 on the outputs from the circuits 610, 614, 610', 614'.

Figure 13:
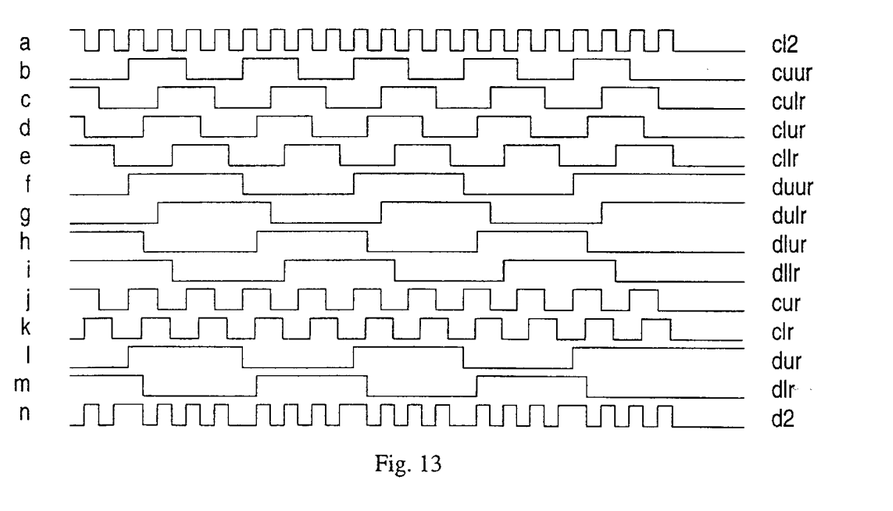

FIG. 13a shows the appearance of the clock signal c12 from the receiving clock domain. FIGS. 13b–e show the clock signals cuur, culr, clur, cllr arriving at the control inputs ci and cip, respectively, of the circuits 612, 616, 612', 616'. The appearance of the output data signals duur, dulr, dlur and dllr from the respective circuits 612, 616, 612', 616' is shown in FIGS. 13f–i.

FIGS. 13j and 13k show the clock signals cur and clr from the output node 1004 to the control inputs ci of the nodes 622 and 622'. FIGS. 13l and 13m show the appearance of the data signals dur and dlr from the circuits 622 and 622' to the output node 1004. FIG. 13n finally shows the appearance of the data signal d2 to the receiving clock domain.

As previously mentioned, and as appears from FIGS. 11–13, the signal treatment in each of the circuits 1006 and 1008 is exactly the same as in the corresponding circuit in FIG. 6, and as appears from FIG. 9. As is made clear by FIG. 13 the result is that the data signal d2 is supplied to the receiving clock domain synchronously with its clock signal c12.

Generally the above, with reference to FIGS. 2, 6 and 10, described circuit solutions can be commonly characterized as including a first circuit part 202, 630 and 1020, respectively, which is designed to receive a fast serial data flow with a first clock speed and serial/parallel convert it, and which is connected to a second circuit part 206, 640 and 1030, respectively, designed to parallel/serial convert the resulting parallel data flow from the first circuit to a fast serial data flow with a second clock speed.

In the above described embodiments, data flip-flops have, as an example, been used in the included data storage elements in the different circuits. By a data flip-flop is meant, in the present context, edge trigged circuit elements, as should have been made clear by the description. It is however implicitly understood that other types of storage elements can be chosen, as e.g. latches in which it is the level of a signal that decides if data shall be entered or stored. The difference is that data is defined a little shorter if the logic is level sensitive instead of edge sensitive. On the other hand it becomes more energy efficient.

In the case that multiplexers are mentioned, it may furthermore be a circuit of a flip-flop type, i.e. data is entered from the upper channel on a rising edge or from the lower channel on a falling edge. It may however also be the case of just a channel selector, which lets data from the upper channel pass through in case of a 1 and through the lower channel in case of a 0.

Figure 14:
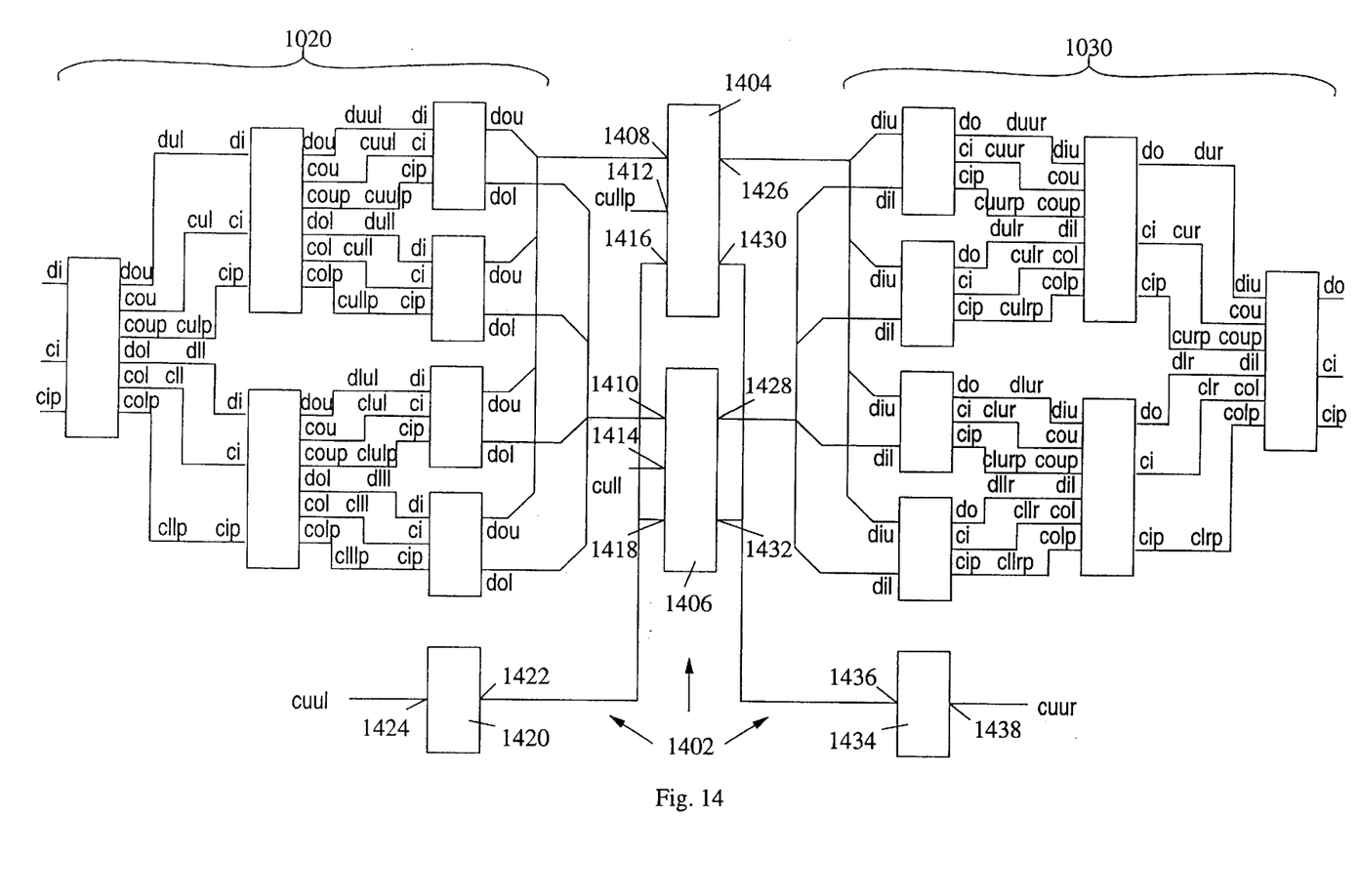
FIG. 14 shows a schematic example on the use of the solution according to FIGS. 10–13 as a ramp to and from an elastically slow FIFO.

FIG. 14 shows schematically an example of use of the solution according to FIGS. 10–13 as a ramp to and from an elastically slow FIFO, generally denoted 1402. This FIFO is built by two memories 1404 and 1406, respectively, of sequential type each with a data input 1408 and 1410, respectively, a control input 1412 and 1414, respectively, and an input 1416 and 1418, respectively, from the output 1422 of a first counter 1420. The counter 1420 has a control input 1424.

The memories 1404 and 1406 furthermore each have a data output 1426 and 1428, respectively, and an input 1430 and 1432, respectively, from the output 1436 of a second counter 1434 The counter 1434 has a control input 1438.

On the input side of the FIFO 1402 the first circuit part 1020 of the circuit solution according to FIG. 10 is connected and on the output side of the FIFO the second circuit part 1030 of the same circuit solution is connected.

More particularly, the four data outputs dou of the circuit part 1020 are commonly connected to the data input 1408 of the memory 1404, and the four data outputs dol of the same circuit part 1020 are connected to the data input 1410 of the memory 1406. The control inputs 1412, 1414 and 1424, respectively, of the two memories 1404 and 1406 and the counter 1420 receive from the circuit part 1020 the inverted clock signal cullp, the clock signal cul and the clock signal cuul, respectively.

The data output 1426 of the memory 1404 is connected to the four data inputs diu of the second circuit part 1030 and the data output 1428 of the memory 1406 is connected to four data inputs dil of the same circuit part 1030. The counter 1434 receives on its control input the clock signal cuur from the second circuit part 1030.

The reason for grouping, in the above described embodiment, the data bits in the way appearing from the description above, can be understood guided by FIG. 12. There it can be shown that first the signals b, d, f and h are switched during one and a half clock cycle of a, thereafter no change occurs during two and a half clock cycle. During this time it is possible to enter the contents of these bits into the memory 1404. The corresponding is true for the signals c, e, g and i with respect to the memory 1406. To the inputs 1416 and 1418 the signal is introduced, that decides when new data is to be entered into the respective memory. This signal should preferably go high during the interval of two and a half bits when no change occurs on the chosen bus. Furthermore also the address should be able to have time to stabilize before the respective input 1414 and 1416 goes high, why another edge is chosen on a suitable distance from the edge on the input in question. For this reason cullp has been chosen for the upper memory circuit and cull for the lower one. By controlling the counter 1420 by the signal cuul a sufficient distance is obtained between the point of time at which the address has been stabilized and the point of time at which data shall be entered by means of cull and culp. The corresponding is true for readouts of data from the memory circuits, whereby possibly circuits (not shown) may be present,. which have a function corresponding to the one obtained through the entering control via the inputs 1416 and 1414. Here there are furthermore corresponding windows for the two blocks present when no entering occurs, and the solution in question presumes that count-up of the read address generator 1434 occurs when no reading takes place.

The advantage of the circuit shown in FIG. 14 is that it permits achievement of a compromise between an energy efficient circuit and a compact circuit. The most compact solution would be a memory circuit combined with a read address generator and a write address generator. The most energy efficient solution consists of circuits of the type described with reference to earlier Figures, up to a certain size of the corresponding tree. This is because the tree grows as two raised to the power of the height of the tree. The extra capacity created by the extra wiring can eventually consume the gain obtained by a few nodes switching over at each clock cycle. Where the limit should be drawn depends on layout and process.

What is claimed is:

1. A data transmission system, in which data streams are transmitted with great speed between a sending clock domain and a receiving clock domain, which operate with mutually different clock speeds, and comprising a first system part circuit for receiving from the sending clock domain a data stream having the clock speed of the sending clock domain, said first system part circuit being controlled by this clock speed for serial/parallel converting the data stream to parallel data streams each having a clock speed that is a certain fraction of the clock speed of the sending clock domain, wherein the first system part circuit includes an input node having a data input for the data stream from the sending clock domain, a control input for a clock signal representing the clock speed of the sending clock domain, data outputs for output data streams, and a first serial/parallel converter circuit for receiving the data stream and the clock signal for converting, controlled by the latter, the input data stream to the parallel data streams each having said clock speed fraction, and wherein said first system part circuit has a tree structure comprising A) the input node in the form of a root node on a first level, B) a number of further levels with leaf nodes, of which each includes    a) a data input for one of the data streams from the leaf nodes of the preceding level,    b) a control input for one of the clock signals with said clock speed fraction from the leaf nodes of the preceding level,    c) data outputs for output data streams,    d) a second serial/parallel converter circuit receiving the data stream and the clock signal from the preceding level and being controlled by this clock signal for converting the input data stream to output data streams having a clock speed forming, for each level, as seen in the direction from the root node, a successively smaller fraction of the sending clock domain's clock speed,    e) a second clock dividing circuit for converting, for each of the output data steams, the clock signal from the preceding level to an output clock signal representing said successively smaller clock speed fraction,    f) outputs for these output clock signals C) a final level with leaf nodes, of which each includes    a) a data input for the data stream from the preceding level,    b) a control input for the clock signal with said successively smaller clock speed fraction,    c) data outputs for output data streams,    d) a third serial/parallel converter circuit receiving the data streams and the clock signal being controlled by the latter for converting the input data stream to output data streams each having said successively smaller clock speed fraction, a second system part circuit for receiving the parallel data streams, said second system part circuit being controlled by the clock speed of the receiving clock domain for parallel/serial converting them to an output data stream to the receiving clock domain having the clock speed of the receiving clock domain, a first clock dividing circuit for converting for each of the output data streams, the clock signal from the sending clock domain to an output clock signal representing said clock speed fraction, and outputs for these output clock signals.

2. A system according to claim 1, wherein the second system part circuit has a tree structure comprising A) an output node in the form of a root node on a final level, with
  a) data inputs for parallel data streams,
  b) a data output for the data stream to the receiving clock domain,
  c) a control input for a clock signal representing the clock speed of the receiving clock domain, and
  d) a first parallel/serial converter circuit receiving the parallel data streams and being controlled by the clock signal for converting these to an output data stream,
  e) a third clock dividing circuit for converting the clock signal received on the control input to a clock signal having a clock speed being a certain fraction of the clock speed of the input clock signal, B) a number of further levels of leaf nodes, which include
  a) data inputs to a multiplexer circuit for parallel data streams from leaf nodes on the closest upper level,
  b) a data output for a data stream created by the multiplexer circuit to a node on the closest lower level,
  c) a control input for a clock signal received from the closest lower level and controlling the operation of the multiplexer circuit,
  d) a fourth clock dividing circuit receiving the clock signal from the closest lower level and creating therefrom a clock signal having a clock speed being a certain fraction of the clock speed of the input clock signal, said clock signal being supplied to the control input of a node on the closest higher level, p1 C) a highest level of leaf nodes, which include
  a) data inputs to a multiplexer circuit for parallel data streams from the first system part circuit,
  b) a data output for a data stream created by the multiplexer circuit to a node on the closest lower level, and
  c) a control input for a clock signal received from the closest lower level and controlling the operation of the multiplexer circuit.

3. A system according to claim 2, wherein a FIFO circuit is connected between the first and second system part circuits, which comprises a memory device of sequential type, into which the data streams from the first system part circuit are entered controlled by the clock speed of the sending clock domain, and from which data is read out to the second system part circuit controlled by the clock speed of the receiving clock domain.

4. A system according to claim 3, wherein the memory device includes a number of memories of sequential type, corresponding to the number of data outputs of each leaf node on the final level of the first system part circuit, each memory having a data input, to which a data output from each leaf node of the final level of the first system part are commonly connected, a data output, which is connected to a data input of each leaf node on the highest level of the second system part circuit, a control input for one of the clock signals transferred to the final level of the first system part circuit, a data input control input from an output of a first counter having an input connected for receiving as a control signal one of the clock signals which are transferred to the final level of the first system part circuit, a data output control input from a second counter having an input connected for receiving as a control signal one of the clock signals which is transferred to the highest level of the second system part circuit.

5. A system according to claim 1, wherein a FIFO circuit is connected between the first and second system part circuits, which comprises a memory device of sequential type, into which the data streams from the first system part circuit are entered controlled by the clock speed of the sending clock domain, and from which data is read out to the second system part circuit controlled by the clock speed of the receiving clock domain.

* * * * *